United States Patent Office 2,892,716

Patented June 30, 1959

2,892,716

PHOTOPOLYMERIZABLE COMPOSITION COMPRISING AN UNSATURATED VINYL POLYMER AND A SHEET SUPPORT COATED THEREWITH

Elmore Louis Martin, Wilmington, Del., assignor to E. I. du Pont de Nemours and Company, Wilmington, Del., a corporation of Delaware No Drawing. Application October 3, 1955
Serial No. 538,277

8 Claims. (Cl. 96—115)

This invention relates to addition polymerizable compositions and articles, and more particularly to photosensitive compositions and articles containing addition polymerizable polyvinyl esters and acetals containing a plurality of lateral substituents having non-terminal ethylenic unsaturation. The invention also relates to processes of making shaped articles including printing reliefs from such compositions.

An object of this invention is to provide a new class of addition polymerizable compositions. Another object is to provide such compositions which upon polymerization have good adherence to sheet supports. Yet another object is to provide such compositions which are soluble in organic solvents. A further object is to provide such compositions which can be rapidly converted by addition polymerization into tough, smooth, tack-free, solvent insoluble shaped articles. A still further object is to provide such compositions which can be rapidly polymerized with the aid of actinic light to form shaped articles. A still further object is to provide such compositions which in the form of solid sheets or layers can be used to make printing reliefs by photopolymerization. Still other objects will be apparent from the following description of the invention.

The novel compositions of this invention comprise as the essential constituents (1) a major proportion of solid polyester, polyacetal or mixed polyesteracetal of a linear hydroxyl polymer containing a large number of recurring intralinear vinyl alcohol (—$CH_2$—CHOH—) units characterized in that up to 15% of the hydroxyl groups are free hydroxyl groups, i.e., remain in the form of such units and 5% to 80% of the hydroxyl groups are esterified and/or acetalized with ethylenically unsaturated carboxylic acids or ethylenically unsaturated aldehydes wherein the ethylenic unsaturation is non-terminal; (2) a minor proportion, generally from 5% to 35% of the whole composition, of an ethylenically unsaturated addition polymerizable monomer boiling above 100° C. at atmospheric pressure; and (3) a small amount, (e.g. 0.05 to 10% by weight) of a free radical generating addition polymerization initiator activatable by actinic light and inactive thermally below 80° C. In the preferred compositions the monomer will be present in amounts from 10% to 25% by weight of the total amount of the foregoing three constituents. The polyesters and acetals also contain ester and/or acetal groups from carboxylic acids, aldehydes, etc., which are free from ethylenic unsaturation. The polymeric constituents of the above compositions contain recurring intralinear —$CH_2$—CHOH— units and recurring intralinear units of at least one of the following types

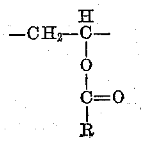

and

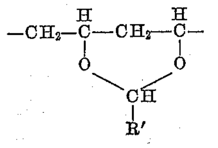

wherein

is the acyl radical of an ethylenically unsaturated carboxylic acid and R′CH< is the oxo-free radical of an ethylenically unsaturated aldehyde in combined acetal form, the unsaturation in both being non-terminal and addition polymerizable, and R and R′ being alike or different.

The foregoing compositions are essentially transparent to actinic light, except, of course, the initiator absorbs some actinic light since it is activated by the latter during a photopolymerization step. In order to insure an essentially transparent mixture, the polymeric component should be compatible with, and preferably is soluble in, the monomeric component. The absorption curve of the composition must have at least one region with a density to actinic light of no more than 1.5 in a 3 mil thickness.

As previously stated, this invention also relates to photopolymerizable elements which are useful in the preparation of relief images and particularly printing reliefs. These elements consist of a solid layer of the above composition, which layer is about 3 to 250 and preferably 10 to 50 mils in thickness and which is disposed on the surface of a suitable sheet support. This layer may be coated directly on the surface of the support or on a suitable layer on the support. For instance, the support may have an antihalation layer and/or an anchor layer on its surface on which the photopolymerizable layer is cast. In the case of transparent supports, the antihalation layer may be on the same side as the polymerizable layer or it may be on the opposite surface.

In general, the support should be of such nature that no more than 35% of the incident light is reflected. With supports which are highly reflective of actinic light, e.g., metal plates or foils, the layer absorptive of actinic light preferably is contiguous with the layer.

Photopolymerizable elements suitable for making relief images can also carry on the uppermost surface a protective strippable coating or layer and on the bottommost surface, that is, the reverse surface of the support, a pressure-sensitive adhesive layer overcoated by a protective strippable layer. Upon the removal of the latter the element can be pressed onto a permanent support, e.g., a printing block or metal plate.

The polymeric, polyhydric alcohol backbone or nucleus of the polymerizable polymeric component of these new compositions will often, for the sake of brevity, be referred to below simply as a polyvinyl alcohol. It will be understood that this term refers broadly to a polymer having a wholly carbon main chain containing a plurality of polymerized, i.e., combined, vinyl alcohol

—$CH_2$CHOH— units intralinear to the polymer chain, whether or not the polymer is polyvinyl alcohol itself or one of a number of related polymers. Thus, in the polyacetals and/or polyesters defined above, the alcohol portion of the molecule is a hydroxyl polymer or copolymer containing a large number of intralinear —$CH_2$CHOH— groups. Such a polymer can be, for example, polyvinyl alcohol itself, i.e., a substantially completely hydrolyzed polyvinyl carboxylate; or it may be a partially hydrolyzed polymer or copolymer with other monomers of a vinyl carboxylate, particularly a vinyl ester of a monocarboxylic acid of one to four carbon atoms, e.g., vinyl formate, vinyl acetate, vinyl chloroacetate, vinyl propionate, vinyl butyrate, etc. The vinyl carboxylate should be sufficiently hydrolyzed so that the —$CH_2$CHOH— groups represent at least 50% of the polymer chain, i.e., for every 100 chain atoms there are at least 25 hydroxyl groups. Hydrolyzed copolymers of vinyl esters with minor proportions (25% or less by weight) or other polymerizable vinyl compounds, e.g., vinyl chloride, methyl methacrylate, etc., are suitable. In particular, the hydrolyzed olefin/vinyl ester copolymers and especially the hydrolyzed ethylene/vinyl acetate copolymers described in U.S. Patents 2,386,347 and 2,397,866, are useful. The preferred starting materials are the 50–100% hydrolyzed polyvinyl acetates.

These various polyvinyl acetals and/or esters can be prepared by well established reaction procedures. For instance, the introduction of the desired acetal component, whether it be the saturated or non-terminally unsaturated type, is conveniently achieved by reacting a polyvinyl alcohol with the appropriate aldehyde or preferably with a monomeric, i.e., simple, acetal thereof, until acetalization of the hydroxyl group has proceeded to the desired extent. When it is desired to introduce esters groups, whether the saturated or lateral non-terminally unsaturated types, the reaction can be simply carried out by direct acylation of the polyvinyl alcohol with the appropriate acylating agent, e.g., acid, anhydride or halide, until the required degree of esterification is achieved. Those products containing mixed ester and acetal groups can be prepared by carrying out the acetalization reaction, for instance, in a solvent medium which consists of or comprises the requisite carboxylic acid desired for the esterification; or conversely the esterification with the requisite carboxylic acid, anhydride or acid halide can be carried out using the requisite aldehyde as solvent medium. In other words, the mixed products can be prepared by simultaneous or separate acetalization and/or esterification with the appropriate saturated and/or non-terminally unsaturated aldehyde or acid derivative. These various operations involve conventional acetalization and acylation procedures, catalysts, and conditions which need not be discussed further here.

The new compositions of this invention can be prepared in many ways from the three essential constituents, i.e., (1), (2) and (3) specified above, by admixing them in any order and, if desired, with the aid of a solvent. Conventional milling, mixing and solution techniques can be applied, the particular technique varying with the difference in properties of the respective components. Care must be taken in preparing a homogeneous admixture of these three components, along with any other added materials, so as not to activate the polymerization initiator so as to induce polymerization, or to induce polymerization in any other manner, or to degrade any of the components.

In order to prevent addition polymerization prior to use, there may be incorporated in the compositions a minor amount, for example, 1 to 500 parts per million of the whole of a stabilizer which prevents addition polymerization, e.g., hydroquinone. Such polymerization inhibitors improve the storage stability of these compositions by preventing thermal polymerization or that induced by minor accidental exposure to light.

This invention is illustrated in greater detail by the following examples in which the parts are by weight unless otherwise noted. These examples describe some of the preferred compositions and the use of the preferred elements of the invention in the preparation of printing plates. Also illustrated in these examples are suitable methods of preparing the requisite polymeric components containing the limited ranges of free hydroxyl and the necessary narrow ranges of lateral, polymerizable non-terminal ethylenically unsaturated groups.

EXAMPLE 1

A. *p-Sorboyloxybenzaldehyde*

A solution of 36 parts of p-hydroxybenzaldehyde, 35 parts of triethylamine and 260 parts of methylene chloride was cooled to 15° C. and a solution of 46 parts of sorboyl chloride in 130 parts of methylene chloride was added dropwise, while maintaining the temperature at 15 to 20° C. by external cooling. Crystals of triethylamine hydrochloride began to separate upon the addition of the acid chloride. After stirring at room temperature for 30 minutes, the mixture was washed three times with dilute hydrochloric acid to remove the triethylamine. The resultant solution was dried with an hydrous magnesium sulfate and concentrated. Upon distillation of the residue, there was obtained p-sorboyloxybenzaldehyde as a colorless liquid boiling at 160° C. under 3 mm. of mercury pressure, which solidified on standing at room temperature. Upon crystallization from a mixture of methylene chloride and diethyl ether, the pure p-sorboyloxybenzaldehyde was obtained as white crystals melting at 74 to 75° C.

*Analysis.*—Calc'd for $C_{13}H_{12}O_3$: C, 72.2; H, 5.6. Found: C, 72.1; H, 5.7.

B. *p-Sorboyloxybenzaldehyde polyvinyl acetal, i.e., polyvinyl p-sorboyloxybenzal*

A mixture of 10 parts of a commercially available 86 to 89% hydrolyzed polyvinyl acetate (viscosity 4 to 6 centipoises in 4% water solution at 20° C.), 25 parts of p-sorboyloxybenzaldehyde (130% of the amount required to react with all the hydroxyl groups present), 80 parts of glacial acetic acid, 6 parts of trifluoroacetic acid, and 0.05 part of hydroquinone was stirred at 60 to 65° C. for 20 minutes. The resultant p-sorboyloxybenzaldehyde polyvinyl acetal was precipitated by the addition of a mixture of ether-petroleum ether. The solvents were decanted from the precipitated product and the heavy, gummy mass was washed with ether. The precipitated polyvinyl acetal was dissolved in acetone and reprecipitated by the addition of ether. The solution and precipitation processes were repeated twice and the product taken up in acetone to give 74 parts of a 30% solids solution. Evaporation of a test portion gave p-sorboyloxybenzaldehyde polyvinyl acetal containing some residual hydroxyl groups and the initial acetoxy groups as a transparent, tough solid, soluble in methanol, ethanol, ethylene glycol, ethyl acetate and methylene chloride but insoluble in water.

C. *Preparation of printing relief images*

To 15 parts of the above solution (containing 4.5 parts of the solid polyvinyl acetal) there was added 1.5 parts of the bis-methacrylate of a polyethylene glycol of average molecular weight 200 and 0.06 part of benzoin methyl ether. The resulting solution was cast on a glass plate and the acetone allowed to evaporate at room temperature in subdued light. The resulting solid, transparent, tack-free layer of the polyacetal/bis-methacrylate/initiator composition was 0.020 to 0.025 inch thick and adhered tenaciously to the glass. A line process negative was placed in intimate contact with the layer and the assembly was placed on a turntable on a piece of black paper (serving as an anti-halation layer) and exposed for a period of 15 minutes under four mercury vapor sunlamps suitably arranged at a distance of 12 to 14 inches above the negative. After removal of the negative, the layer in the unexposed areas was removed by washing in acetone for 2 to 3 minutes. The resultant relief image of the text of the negative had excellent sharpness and deep recess areas and was suitable for direct use as a printing relief.

EXAMPLE 2

A. *p-Crotonoyloxybenzaldehyde*

A solution of 73 parts of p-hydroxybenzaldehyde, 71 parts of triethylamine, and 325 parts of methylene chlorine was cooled to 15° C. and a solution of 73 parts of crotonoyl chloride in 75 parts of methylene chloride was added dropwise, the temperature being maintained at 15 to 20° C. by means of external cooling. The mixture was stirred at room temperature for one hour after the addition of the acid chloride was complete, then washed three times with dilute hydrochloric acid. After drying with anhydrous magnesium sulfate, the solution was concentrated and the residue was distilled. There was obtained 90 parts of p-crotonoyloxybenzaldehyde as a colorless liquid, boiling at 130° C. under 1 mm. of mercury pressure, which solidified on standing at room temperature.

*Analysis.*—Calc'd for $C_{11}H_{10}O_3$; C, 69.4; H, 5.3. Found: C, 69.0; H, 5.4.

B. *p-Crotonoyloxybenzaldehyde polyvinyl acetal, i.e., polyvinyl p-crotonoyloxybenzal*

A mixture of 10 parts of the polyvinyl alcohol used in Example 1, 25 parts of p-crotonoyloxybenzaldehyde (145% of the amount required to react with all the hydroxyl groups present), 80 parts of glacial acetic acid, 6 parts of trifluoroacetic acid, and 0.02 part of hydroquinone was stirred at 60 to 65° C. for 20 minutes. The p-crotonoyloxybenzaldehyde polyvinyl acetal thus obtained was precipitated and purified as described in Example 1. The polymer was a solid polyvinyl acetal containing, besides some residual hydroxyl groups, acetoxy groups from the starting material.

C. *Preparation of printing relief images*

To 18 parts of a 30% solids acetone solution of the above p-crotonoylbenzaldehyde polyvinyl acetal, there was added 1.8 parts of the bis-methacrylate of a polyethylene glycol of average molecular weight 200 and 0.08 part of benzoin methyl ether and the resulting solution was cast on glass plates. After evaporation of the acetone at room temperature in subdued light, a transparent, tack-free film of the polyvinyl acetal, containing some hydroxyl and acetoxy groups/bis-methacrylate monomer/initiator composition was obtained. Exposure under a process negative and removal of the layer in the unexposed areas as described in Example 1–C gave a scratch-resistant printing relief image of the text in the negative, said relief being sharp and having deep recess areas. Equally good relief images were obtained with compositions containing 20 and 30% by weight of the bis-methacrylate, i.e., 3.6 and 5.4 parts, respectively.

EXAMPLE 3

A. *o-Crotonoyloxybenzaldehyde*

Example 2–A was repeated substituting 86 parts of salicylaldehyde for the p-hydroxybenzaldehyde. There was obtained 102 parts of o-crotonoyloxybenzaldehyde as a clear liquid, boiling at 123 to 125° C. under 1 mm. of mercury pressure, which solidified on standing.

B. *o-Crotonoyloxybenzaldehyde polyvinyl acetal, i.e., polyvinyl o-crotonoyloxybenzal*

A mixture of 15 parts of the polyvinyl alcohol used in Example 1, 37.5 parts of o-crotonoyloxybenzaldehyde (145% of the amount required to react with all the hydroxyl groups present), 100 parts of glacial acetic acid, 7.5 parts of trifluoroacetic acid, and 0.05 part of hydroquinone was stirred at 60 to 65° C. for 20 minutes. The resulting o-crotonoyloxybenzaldehyde polyvinyl acetal was precipitated and purified as described in Example 1–B. The solvent-free polyvinyl acetal containing some free hydroxyl groups and the initial acetoxy groups was a transparent, tough solid.

C. *Preparation of printing relief images*

To 30 parts of a 37% solids acetone solution of the above o-crotonoyloxybenzaldehyde polyvinyl acetal, there was added 2.8 parts of the bis-methacrylate of a polyethylene glycol of average molecular weight 200 and 0.14 part of benzoin methyl ether and the resulting solution was cast on glass plates. After evaporation of the acetone at room temperature in subdued light, a soft, pliable, tack-free film of the polyacetal/bismethacrylate/initiator composition was obtained. Exposure under a process negative and removal of the material in the unexposed areas as described in Example 1–C gave a scratch-resistant printing relief image of the text of the negative exhibiting excellent sharpness and having deep recess areas. An equally good relief image was obtained with a composition containing 30% by weight (9 parts) of the bis-methacrylate.

EXAMPLE 4

A. *Polyvinyl acetate/sorbate, i.e., poly(vinyl acetate co vinyl sorbate)*

A mixture of 20 parts of the polyvinyl alcohol used in Example 1, 20 parts of sorbic acid, 50 parts of glacial acetic acid, 3.8 parts of trifluoroacetic acid, and 0.2 part of hydroquinone was stirred at 70 to 75° C. for 15 minutes. Acetic anhydride (10 parts) was added and the mixture was stirred for 10 minutes. An additional 10 parts of acetic anhydride was added and the temperature was allowed to drop to 50° C. during the course of 10 minutes. Ten (10) parts of a mixture of 30 parts of acetic anhydride and 0.2 part of 95% sulfuric acid was added and the mixture stirred for 10 minutes at 50° C. Additional 10-part portions of the acetic anhydride-sulfuric acid mixture were added at 10-minute intervals. After a total reaction time of 3 hours, the reaction mixture was completely soluble in such solvents as acetone, ethyl acetate, and methylene chloride. One (1) part of sodium acetate dihydrate was added and after stirring for an additional 5 minutes, the reaction mixture was poured into water whereupon the polyvinyl mixed acetate/sorbate containing substantially no free hydroxyl groups separated as a gummy mass. This product was washed by decantation, taken up in acetone and reprecipitated by the addition of water. The solution and precipitation steps were repeated twice more, neutralizing the solution with aqueous sodium bicarbonate solution before the final precipitation. The resultant polyvinyl acetate/sorbate was dissolved in a mixture of ethyl acetate/methylene chloride and the solution was dried with anhydrous magnesium sulfate, filtered, and concentrated under reduced pressure to 144 parts of a 25.6% solids solution of the copolyester. Addition of a solution of bromine in methylene chloride to a test portion of the above solution resulted in immediate disappearance of the bromine.

B. *Preparation of printing relief images*

To 140 parts of the above copolyester solution was added 8 parts of the bis-methacrylate ester of a polyethylene glycol of average molecular weight 200, 0.48 part of benzoin methyl ether, and 0.0048 part of hydroquinone. The resulting solution was cast in a cell comprising a transparent sheet of moist regenerated cellulose film squeegeed to a glass plate as a base and retaining walls of polyvinyl alcohol coated paper. The cell size was such that after evaporation of the solvents in subdued light, there was obtained a somewhat tacky, essentially transparent 0.035 to 0.040-inch thick film of the copolyester/bis-methacrylate/initiator composition coated on the transparent film base. A portion of the film was placed top down on a second glass plate and exposed through the transparent cellulose base under a process negative as described in Example 1–C. After exposure, the regenerated cellulose layer was removed by moistening with water and the material in the unexposed areas was removed by washing in acetone for 2 to 3 minutes. There was thus obtained a sharp, somewhat rubbery printing relief image of the text in the negative with deep recess areas.

EXAMPLE 5

A. *Polyvinyl alcohol mixed acetate/p-sorboyloxybenzaldehyde/benzoyloxybenzaldehyde acetal, i.e., poly(vinyl acetate co vinyl p-sorboyloxybenzal co vinyl benzoyloxybenzal)*

A mixture of 20 parts of a commercially available, medium viscosity, 86 to 89% hydrolyzed polyvinyl acetate, 30 parts of p-benzoyloxybenzaldehyde, 20 parts of p-sorboyloxybenzaldehyde, 200 parts of glacial acetic acid, 15 parts of trifluoroacetic acid, and 0.1 part of hydroquinone was stirred at 60 to 65° C. for 30 minutes. The polyvinyl alcohol mixed acetate/p-sorboyloxybenzal/p-benezoyloxybenzal containing some free hydroxyl groups was precipitated and purified as described in Example 1–B, except that methylene chloride was substituted for acetone. There was obtained 551 parts of an 8.2% solids methylene chloride solution of the polyvinyl acetate/acetal.

B. *Preparation of printing relief images*

To 546 parts of this solution was added 19 parts of the bis-methacrylate of a polyethylene glycol of average molecular weight 200, 0.65 part of benzoin methyl ether, and 0.007 part of hydroquinone. The resulting solution was cast in a cell as described in Example 4–B. After evaporation of the solvent at room temperature in subdued light, a transparent, essentially tack-free, flexible film of the acetate/benzal copolymer/bismethacrylate/initiator composition coated on the transparent base was obtained. Exposure of a test portion of the film under a process negative and removal of the unexposed areas as described in Example 4 gave a hard, scratch-resistant printing relief image of the text of the negative with deep recess areas.

EXAMPLE 6

A. *Polyvinyl acetate/cinnamate, i.e., poly(vinyl acetate co vinyl cinnamate)*

A mixture of 20 parts of the polyvinyl alcohol used in Example 1, 20 parts of cinnamic acid, 50 parts of glacial acetic acid, 3.3 parts of trifluoroacetic acid, and 0.1 part of hydroquinone was stirred at 75 to 85° C. for 65 minutes. The mixture was cooled to 60° C., and 10 parts of a mixture of 50 parts of acetic anhydride and 0.2 part of 95% sulfuric acid was added with stirring. After 10 minutes, and at 10-minute intervals thereafter for a period of two hours at 60° C., additional 10-part portions of the acetic anhydride/sulfuric acid mixture were added with stirring, during which time a homogeneous solution was obtained. The resulting reaction mixture was completely soluble in methylene chloride, acetone and ethyl acetate. The polyvinyl mixed acetate/cinnamate containing substantially no free hydroxyl groups was precipitated and purified as in Example 5–A. There was thus obtained 147 parts of a 24% solids methylene chloride solution of the polyvinyl coester. Addition of a solution of bromine in methylene chloride to a test portion of this solution resulted in immediate disappearance of the bromine.

B. *Preparation of printing relief images*

To 140 parts of the above copolyvinyl ester solution was added 8.5 parts of the bis-methacrylate ester of a polyethylene glycol of average molecular weight 200, 0.5 part of benzoin methyl ether, and 0.005 part of hydroquinone. The resulting solution was cast into a cell as described in Example 4–B. After evaporation of the solvent at room temperature in subdued light, a transparent, slightly tacky film of the copolyester/bis-methacrylate/initiator composition coated on the transparent base was obtained. Exposure under a suitable process negative and removal of the unexposed areas as described in Example 1–C gave a rubbery, fairly sharp printing relief image of the text in the negative with deep recess areas.

EXAMPLE 7

A. *p-Cinnamoyloxybenzaldehyde*

This compound was prepared as described in Example 1–A substituting 183 parts of cinnamoyl chloride for the sorboyl chloride. Crystallization from methylene chloride-ether gave p-cinnamoyloxybenzaldehyde as colorless crystals melting at 95 to 96° C.

*Analysis.*—Calc'd for $C_{16}H_{12}O_3$: C, 76.2; H, 4.8. Found: C, 76.5; H, 4.9

B. *Polyvinyl alcohol mixed acetate/p-benzoyloxybenzaldehyde/p-cinnamoyloxybenzaldehyde acetal, i.e., poly(vinyl acetate co vinyl p-benzoyloxybenzal co vinyl p-cinnamoyloxybenzal)*

A mixture of 20 parts of the polyvinyl alcohol used in Example 1, 12 parts of p-cinnamoyloxybenzaldehyde, 120 parts of glacial acetic acid, and 9 parts of trifluoroacetic acid was stirred at 65° C for 10 minutes. Thirty 30) parts of p-benzoyloxybenzaldehyde was added and the mixture was stirred an additional 15 minutes at 60 to 65° C. The polyvinyl alcohol mixed acetate/p-benzoyloxybenzal/p-cinnamoyloxybenzal containing some free hydroxyl groups was precipitated and purified as in Example 5–A. There was obtained 359 parts of an 11.5% solids methylene chloride solution of the polyvinyl acetate/acetal.

B. *Preparation of printing relief images*

To 350 parts of this solution there was added 22 parts of the bis-methacrylate of a polyethylene glycol of average molecular weight 200, 0.7 part of benzoin methyl ether, and 0.002 part of hydroquinone. The resulting solution was cast into a cell as described in Example 4–B. Evaporation of the solvent at room temperature gave a transparent, flexible, tack-free film of the copolyester acetal/bismethacrylate/initiator composition coated on the transparent base. Exposure under a process negative and removal of the layer in the unexposed areas as described in Example 4–B resulted in the formation of a fairly sharp, rubbery printing relief image of the text in the negative having good recess areas.

EXAMPLE 8

A. *Polyvinyl alcohol mixed acetate/benzaldehyde/crotonaldehyde acetal, i.e., poly(vinyl acetate co vinyl benzal co vinyl crotonal)*

A mixture of 30 parts of the polyvinyl alcohol used in Example 1, 13.3 parts of benzaldehyde, 8.9 parts of crotonaldehyde, 125 parts of glacial acetic acid, 7.5 parts of trifluoroacetic acid, and 0.1 part of hydroquinone was stirred at 70 to 75° C. for 15 minutes. The reaction mixture was cooled to 70° C. and 50 parts of acetic anhydride was added. The resulting mixture was stirred at 75° C. for 15 minutes and the polyvinyl acetate/benzal/crotonal containing substantially no free hydroxyl groups was precipitated and purified as in Example 5–A. There was thus obtained 240 parts of an 18% solids methylene chloride solution of the polyvinyl acetate/acetal.

B. *Preparation of printing relief images*

To 71 parts of the above solution there was added 5.5 parts of triethylene glycol dimethacrylate, 0.002 part of hydroquinone, and 0.22 part of benzoin methyl ether. The solution was cast in a cell as described in Example 4–B. Evaporation of the solvent at room temperature in subdued light gave a slightly tacky, transparent film of the copolyester acetal/dimethacrylate/initiator composition coated on the transparent base. Exposure under a process negative and removal of the unexposed areas as described in Example 4–B gave a sharp, scratch-resistant printing relief image of the text in the negative with good recess areas.

EXAMPLE 9

A. *Polyvinyl alcohol mixed acetate/n-butyraldehyde/crotonaldehyde acetal, i.e., poly(vinyl acetate co vinyl butyral co vinyl crotonal)*

A mixture of 30 parts of the polyvinyl alcohol used in Example 1, 8.8 parts of n-butyraldehyde, 8.8 parts of crotonaldehyde, 125 parts of glacial acetic acid, 7.5 parts of trifluoroacetic acid, and 0.1 part of hydroquinone was stirred at 70 to 75° C. for 15 minutes. The reaction mixture was cooled to 70° C., 25 parts of acetic anhydride was added and the stirring at 70° C. continued for 15 minutes. The polyvinyl acetate/n-butyral/crotonal containing substantially no free hydroxyl groups was precipitated and purified as in Example 5–A. There was thus obtained 231 parts of a 16% solids methylene chloride solution of the polyvinyl acetate/acetal.

B. *Preparation of printing relief images*

To 100 parts of the above solution there was added 5.5 parts of triethylene glycol dimethacrylate, 0.22 part of benzoin methyl ether, and 0.001 part of hydroquinone. The resulting solution was cast in a cell as described in Example 4–B. Evaporation of the solvent at room temperature in subdued light gave an essentially tack-free film of the copolyester acetal/dimethacrylate/initiator composition coated on the transparent base. Exposure under a suitable negative and removal of the layer in the unexposed areas as described in Example 4–B gave a sharp, scratch-resistant printing relief image of the text of the negative with deep recess areas.

EXAMPLE 10

A. *Polyvinyl alcohol mixed acetate/n-butyraldehyde/crotonaldehyde acetal, i.e., poly(vinyl acetate co vinyl n-butyral co vinyl crotonal)*

Example 9 was repeated using 14.4 parts of n-butyraldehyde and only 3.5 parts of crotonaldehyde. There was thus obtained 218 parts of an 18% solids methylene chloride solution of the polyvinyl acetate/n-butyral/crotonal.

B. *Preparation of printing relief images*

To 90 parts of this solution there was added 5.5 parts of triethylene glycol dimethacrylate, 0.23 part of benzoin methyl ether, and 0.001 part of hydroquinone. The resulting solution was cast in a cell as described in Example 4–B. Evaporation of the solvent at room temperature in subdued light gave an essentially tack-free film of the copolyester acetal/dimethacrylate/initiator composition coated on the transparent base. Exposure under a process negative and removal of the unexposed areas as described in Example 4–B gave a sharp, scratch-resistant printing relief image of the text in the negative with good recess areas.

EXAMPLE 11

A. *m-Sorbamidobenzaldehyde ethylene glycol acetal*

To a mechanically stirred solution of 50 parts of m-aminobenzaldehyde ethylene glycol acetal (U.S. Patent 2,481,434) in 20 parts of acetone and 5 parts of ice, there was added dropwise a solution of 46 parts of sorboyl chloride in 50 parts of dioxane. The temperature was maintained at 0 to 5° C. by means of external cooling and the reaction mixture was kept at pH 7 to 9 by the portion-wise addition of a solution of 50 parts of potassium carbonate in 50 parts of water. The reaction product, m-sorbamidobenzaldehyde ethylene glycol acetal, separated as an oil that solidified. The reaction mixture was stirred for an additional period of 30 minutes and diluted with an equal volume of cold water. The solid was collected and washed with cold water. Crystallization from methylene chloride-ether gave m-sorbamido ethylene glycol acetal as colorless crystals melting at 118 to 120° C.

*Analysis.*—Calc'd for $C_5H_{17}O_3N$: C, 69.5; H, 6.6; N, 5.4. Found: C, 69.3; H, 6.3; N, 5.4.

B. *Polyvinyl alcohol mixed acetate/m-sorbamidobenzaldehyde acetal, i.e., poly(vinyl acetate co vinyl m-sorbamidobenzal)*

A mixture of 10 parts of the polyvinyl alcohol used in Example 1, 5 parts of m-sorbamidobenzaldehyde ethylene glycol acetal, 60 parts of glacial acetic acid, 4.5 parts of trifluoroacetic acid, and 0.05 part of hydroquinone was stirred at 80 to 85° C. for 45 minutes. The reaction mixture was cooled to 70° C., and 30 parts of acetic anhydride was added over a period of 10 minutes. The mixture was stirred an additional period of 15 minutes and the polyvinyl acetate/m-sorbamidobenzaldehyde acetal containing substantially no free hydroxyl groups was precipitated as a gummy mass by the addition of ether-petroleum ether. The precipitated polyvinyl acetate/acetal was dissolved in a mixture of acetone and methanol. The precipitation and solution steps were repeated 3 more times affording 47 parts of a 39% solids solution of the copolyester acetal. A test portion was evaporated to dryness at 50° C. The nitrogen content of the solid polyvinyl acetate/acetal was 1.59% N, indicating the copolymer to be a 32.4/67.6 by weight vinyl m-sorbamidobenzal/vinyl acetate copolymer or expressed alternatively a polyvinyl alcohol in which 22.4% of the hydroxyls are involved in acetal linkages with m-sorbamidobenzaldehyde and substantially all the remaining hydroxyl groups are esterified with acetic acid.

C. *Preparation of printing relief images*

To 40 parts of the above solution, there was added 4.5 parts of the bis-methacrylate of a polyethylene glycol of average molecular weight 200, and 0.15 part of benzoin methyl ether. The resulting solution was cast on glass plates. Evaporation of the solvents at room temperature in subdued light gave essentially tack-free, transparent films of the copolyester acetal/dimethacrylate/initiator composition. Exposure under a process negative and removal of the unexposed areas as described in Example 1–C gave a sharp printing relief image of the text in the negative with deep recess areas.

From the foregoing, it will be apparent that the polyvinyl acetals and polyvinyl esters which constitute the polymeric components of these new compositions have a definite chemical constitution and properties. They must have no less than 5% of the hydroxyl groups of the intralinear —$CH_2CHOH$— units linked by ester or acetal linkages to lateral side chains containing non-terminal addition polymerizable ethylenic groups. Polymers of this general structure but containing less than 5% of such groups do not confer upon the compositions satisfactory polymerization speed and require unsatisfactorily long exposure times. Furthermore, even when polymerized the space network structure thus established is not as tightly crosslinked as is desired and the polymerized compositions therefore do not exhibit the desired physical or solvent resistant properties. However, it is not enough that the polymeric component have at least 5% of such groups but for the outstanding compositions of the present invention there cannot be more than 80% of the hydroxyl groups involved in such linkages. Polymers containing more than 80% of lateral, non-terminal, addition polymerizable ethylenically unsaturated, ester or acetal groups surprisingly do not confer upon the compositions the desired polymerization speed and require therefore undesirably long exposure times. Furthermore, the latter compositions when polymerized exhibit undesirable wear characteristics in printing plate usage and in some instances in the higher substituted ranges are inclined to be brittle.

An important feature of the polymerizable polyvinyl acetal or polyvinyl ester components of the compositions of this invention is that there cannot be more than 15% of free hydroxyl groups on the main polymer chain or backbone. Polymers containing more free hydroxyl groups than the 15% upper limit are too water-sensitive for successful use in the preparation of printing plates, tending to deform readily prior to polymerization and thereby rendering the polymerizable elements difficult to handle and retain the necessary planar relationship of the upper surface thereof which is required to insure the formation of a printing plate having uniform printing height. Furthermore, the polymerized compositions wherein the polymeric component has a greater percentage of free hydroxyl groups than the 15% upper limit are likewise difficult to retain in their desired shape during printing use.

From the foregoing, it is apparent that the polymeric components of these polymerizable compositions will thus have from 5 to 80% of the original hydroxyl groups converted to acetal and/or ester linkages with lateral substituents containing addition polymerizable non-terminal ethylenic groups. These groups can be acetal or entirely ester or mixed acetal and ester groups of this structure within the defined limits. The polymers can have no more than 15% free hydroxyl groups and the preferred polymeric components will have less than 10% free hydroxyl groups. It is apparent, therefore, that in every instance the polyvinyl alcohol acetals and esters must of necessity contain lateral, non-polymerizable, saturated acetal, ester, ether, or like groups in amount corresponding to the difference between the percent of polymerizable acetal or ester linkages and the percent of free hydroxyl units versus the total number of hydroxyl units available.

As in the case of the lateral polymerizable acetal or ester groups, these necessary saturated acetal ester, ether, or like unpolymerizable groups can be wholly acetal, wholly ester, wholly ether, or mixed such groups. Furthermore, as in the case of the polymerizable lateral unsaturated acetal or ester groups, mixed acetal, mixed ester, mixed ether, mixed acetal and ester substitutions, etc., are possible. To illustrate specifically, the polymeric components of these new compositions can comprise 10/30/60 poly(vinyl alcohol co vinyl crotonate co vinyl butyral), 5/35/60 poly(vinyl alcohol co vinyl acetate co vinyl crotonal), 20/60/20 poly(vinyl acetate co vinyl butyral co vinyl crotonate), 30/25/45 poly(vinyl acetate co vinyl crotonate co vinyl butyral), 5/20/10/40/25 poly(vinyl alcohol co vinyl acetate co vinyl butyrate co vinyl butyral co vinyl crotonal), 10/10/25/20/35 poly(vinyl alcohol co vinyl acetate co vinyl crotonate co vinyl acetal co vinyl butyral) compositions, and the like. In order to obtain firm printing images, substituent groups, e.g., ester, acetal, ether, and the like, of less than 12 carbon atoms are preferred. Other specific polymeric components in this class include like mixed ester, ether, acetal, etc. polymers; 5/20/10/65 poly(vinyl alcohol co vinyl crotonal co vinyl benzal co vinyl acetate); 20/20/60 poly(vinyl p-sorboyloxybenzal co vinyl benzal co vinyl acetate) 5/30/20/30/15 poly(vinyl alcohol co vinyl p-crotonoyloxybenzal co-vinyl p-benzoyloxybenbal co vinyl butyral co vinyl acetate); 10/30/20/40 poly(vinyl acetal co vinyl crotonal co vinyl chloroacetal co vinyl acetate); 25/10/35/30 poly(vinyl p-cinnamoyloxybenzal co vinyl benzal co vinyl butyral co vinyl acetate); 5/30/10/30/15 poly(vinyl alcohol co vinyl crotonal co vinyl butyral co vinyl benzoate co vinyl acetate); 5/30/30/35 poly(vinyl alcohol co vinyl p-sorboyloxybenzal co vinyl p-chlorobenzal co vinyl propionate); 15/35/35/15 poly(vinyl butyral co vinyl o-crotonoxybenzal co vinyl benzoate co vinyl acetate); 25/30/45 poly(vinyl cinnamal co vinyl benzal co vinyl acetate).

Like the polymerizable polymeric components of the new compositions of this invention, the monomeric component is similarly narrowly and precisely defined. This monomer component must have a minimum boiling point of 100° C. at atmospheric pressure and furthermore must form with the polymeric component a substantially homogeneous and transparent composition. Generally speaking, the monomers will not boil above 250–300° C. under 0.1 mm. of mercury. The monomer component, as previously indicated, constitutes 5–35%, and preferably 10–25% by weight, of the total composition.

Because of their availability and easier polymerizability, the addition polymerizable vinylidene monomers, that is, monomers having at least one terminal methylene group linked to adjacent carbon, i.e., having at least one $CH_2{=}C{<}$ group, are preferred. Because of their more rapid crosslinking properties, i.e., greater speed with which the compositions are rendered insoluble and infusible, the polymerizable vinylidene monomers containing a plurality of such groups are especially preferred. Because of their more rapid rate of polymerization, the vinylidene monomers, including both those having only one such group and a plurality of such groups, wherein the said vinylidene is conjugated with a doubly bonded carbon, including carbon doubly bonded to carbon itself and such heteroatoms as oxygen, nitrogen, and sulfur are preferred. Such monomers will be found among the carboxylic acids, esters, nitriles; sulfonic acids, esters; carboxaldehydes; and ether; etc. To illustrate them specifically, there may be mentioned such typical unsaturated acids and esters thereof as acrylic acid, methacrylic acid, ethylene diacrylate, diethylene glycol diacrylate, glycerol diacrylate, glycerol triacrylate, ethylene dimethacrylate, propylene dimethacrylate, 1,2,4-butane trimethacrylate, cyclohexane diacrylate, 1,4-benzene dimethacrylate, pentaerythritol tetramethacrylate, 1,3-propane diacrylate, 1,5-pentane dimethacrylate, the bis-acrylates and methacrylates of polyols, e.g., polyethylene glycols of molecular weight 300–500 etc.; such typical unsaturated amides as acrylamide, methacrylamide, methylene bis-acrylamide, methylene bis-methacrylamide, ethylene bis-methacrylamide, hexane-1,6-diacrylamide, and tris-methacrylamide of diethylenetriamine; such vinyl esters as vinyl benzoate, divinyl succinate, divinyl adipate, divinyl phthalate, divinyl terephthalate, divinyl sebacate, divinyl benzene-1,3-disulfonate, and divinyl butane-1,4-disulfonate; such unsaturated aldehydes as acrylamidoacetaldehyde, β-(methacrylamido)propionaldehyde, α-vinylcrotonaldehyde, α-phenylacrolein, o-acryloyloxybenzaldehyde, m-(α-ethylacrylamido) benzaldehyde, 1-vinyl-4-naphthaldehyde, 2-acrylamido-4-naphthaldehyde, 4-vinyl-4′-formylbiphenyl, and p-(2-methacryloyloxyethoxy)benzaldehyde.

As has been pointed out in the foregoing description, the polymerizable polymeric and monomeric components of these new compositions must be carefully selected from the many such available polymers and monomers. The same is true for the necessary addition polymerization initiator. In the first place, the photo initiator, i.e., addition polymerization catalyst activatable by actinic light, must be compatible with both the necessary polymeric and monomeric components, as well as any other added organic or inorganic fillers or the like, and is preferably soluble in the monomeric component. In any event, it must be capable of being substantially completely homogeneously distributed throughout the new compositions. In the second place, since most conventional light sources gives off both heat and light, both of which are transmitted by the image-bearing process transparencies used in the process, the free radical generating, addition polymerization initiators should not be activatable thermally. This is also important since polymerization, once initiated, generates heat as the polymerization proceeds and transmits some of such heat to areas of the compositions outside the exposed areas and in order to preserve ultimate fidelity of the printing image, such transmitted heat should not be permitted to initiate polymerization in the unexposed areas. Precautions can be taken to exclude to some extent the heat rays emanating from the light source and to remove heat buildup caused by polymerization, so as to maintain the photopolymerizable layer at temperatures which are not effective in activating the initiator thermally. The complete exclusion of input or generated heat, however, requires necessary longer exposure times since the rate of chain propagation in the polymerization reaction is lower at reduced temperatures.

Thus, the free radical generating addition polymerization initiators which must be used in these new compositions are those capable of initiating polymerization under the influence of actinic light which are dispersible in the aforesaid described polymerizable polyvinyl alcohol acetal and/or ester/monomer compositions to the extent necessary for initiating the desired polymerization under the influence of the light energy available and which are not active thermally at temperatures below 80–85° C. The preferred initiators are those which are most rapidly affected by the light energy available in the shortest exposure times to initiate the greatest number of growing polymer chains. These photopolymerization initiators are used in amounts of from 0.05 to 10.0% and preferably from 0.1 to 5.0% by weight, based on the weight of the total composition. Suitable initiators include vicinal ketaldonyl compounds, e.g., diacetyl and benzil; α-ketaldonyl alcohols, e.g., benzoin and pivaloin; acyloin ethers, e.g., benzoin methyl and ethyl ethers; and α-hydrocarbon substituted aromatic acyloins, including, α-methyl benzoin, α-allylbenzoin and α-phenylbenzoin.

As described previously in detail, the polymeric components of the new compositions of this invention must always have, in addition to the previously defined percentage ranges of lateral, non-terminal, addition polymerizable, acetal or ester functions, from 5 to 95% of the hydroxyls of the parent polyvinyl alcohol covered by lateran nonpolymerizable groups, bonded to the polyvinyl alcohol main chain through ester, ether, acetal, or like oxygen-containing functions. These saturated inert substituents decrease the number of available hydroxyl groups in the polymer to the aforesaid described maximum percentage and render the polymeric compositions suitably water insensitive. Suitable such inert substituents are preferably carboxylic acid ester groups, e.g., acetate, propionate, and butyrate, particularly the acetate since this is the cheapest and most readily available; sulfonic acid ester groups, e.g., benzenesulfonate, p-toluenesulfonate and methanesulfonate; ether groups derived from saturated alcohols, eg., butyl, propyl, methyl and hexyl ether groups; saturated acetal groups derived from saturated aldehydes, e.g., formaldehyde, acetaldehyde, propionaldehyde, isobutyraldehyde, furfuryl, cyclohexylaldehyde, o-chlorobenzaldehyde, and phenylacetaldehyde, of which the aromatic aldehydes are preferred due to the better physical properties they impart to the polymer. In any event, the inert lateral ester, ether, acetal, or like substituents are those preferably containing from one to no more than 18 carbon atoms, and particularly from one to 12 carbon atoms, of which the aromatic ester and acetal substituents of from 7 to 11 carbons in which the ester or aldehyde group is directly attached to a cyclic carbon atom of an aromatic carbocyclic ring, are particularly preferred.

This invention also includes photopolymerizable elements suitable for the preparation of printing relief images. It has been found that letterpress printing plates which have uniform printing height can be prepared by exposing with actinic light through a stencil or process transparency, e.g., a process negative or positive (an image-bearing transparency consisting solely of substantially opaque and substantially transparent areas where the opaque areas are substantially of the same optical density, the so-called line or halftone negative or positive) a solid photopolymerizable layer or stratum of a composition of this invention comprising (1) an unsaturated polyvinyl acetal and/or ester having lateral, non-terminal, polymerizable unsaturation, (2) a polymerizable monomer, and (3) having intimately dispersed therethrough an addition polymerization initiator activatable by actinic light, all as described in detail in the foregoing, said layer or stratum being superposed on a suitable adherent support, i.e., adherent to the photopolymerized composition, until substantially complete crosslinking through the polymerizable groups takes place in the exposed areas, while substantially none takes place in the non-exposed areas, and essentially completely removing the layer, i.e., the non-crosslinked polymer together with any admixed material, in said non-exposed areas.

The ethylenically unsaturated polyvinyl acetal and/or ester layer being transparent to actinic light is photopolymerized, i.e., crosslinked and rendered insoluble, clear through to the support; whereas, the areas not exposed remain in substantially their original state, that is, no significant crosslinking takes place in the areas protected by the opaque images in the process transparency. The unexposed, and therefore non-crosslinked, material is then removed by treating the layer with a solvent for the original polyvinyl acetal and/or ester composition. The crosslinked (exposed) portions being insoluble in practically all solvents remain unattacked, forming the relief image.

The thickness of the photopolymerizable layer is a direct function of the thickness desired in the relief image and this will depend on the subject being reproduced and particularly on the extent of the non-printing areas. In the case of photopolymerized halftones, the screen used also is a factor. In general, the thickness of the layer to be photopolymerized on the base plate will vary from 0.003 to 0.25 inch. Layers ranging from 0.003 to 0.03 inch in thickness and usually from 0.003 to 0.007 inch are suitable for halftone plates. Layers ranging from 0.01 to about 0.06 inch in thickness will be used for the majority of letterpress printing plates, and it is with these thicknesses that the process of this invention is particularly effective. Layers thicker than 0.05–0.06 inch will be used for the printing of designs and relatively large areas in letterpress printing plates.

Actinic light from any source and of any type can be used in carrying out this process. The light may emanate from point sources or be in the form of parallel rays or divergent beams. In order to reduce the exposure time, however, it is preferred to use a broad light source, i.e., one of large area as contrasted to a point source of light, close to the image-bearing transparency from which the relief image is to be made. By using a broad light source, relatively close to the image-bearing transparency, the light rays passing through the clear areas of the transparency will enter as divergent beams into the photopolymerizable layer, and will thus irradiate a diverging area in the photopolymerizable layer underneath the clear portion of the transparency, resulting in the formation of a polymeric relief which is at its greatest width at the bottom surface of the photopolymerized layer, the top surface of the relief being the dimensions of the clear area. Such relief images are advantageous in printing plates because of their greater strength and the smooth continuous slope of their sides as contrasted to the undercut or jagged, irregular nature of the sides of photoengraved reliefs. This is of importance since the smooth sloping reliefs obtained in this process reduce or eliminate the problem of ink-buildup that is always encountered with photoengraved plates.

Inasmuch as the photopolymerization initiators or catalysts used generally exhibit their maximum sensitivity in the ultraviolet range, the light source should furnish an effective amount of this radiation. Such sources include carbon arcs, mercury vapor arcs, fluorescent lamps with special ultraviolet light emitting phosphors, argon glow lamps, and photographic flood lamps. Of these, the mercury vapor arcs, particularly the sunlamp type, and the fluorescent sunlamps, are most suitable. Groups of these lamps can be easily arranged to furnish the broad light source required to give a frustum-shaped relief image of good mechanical strength. The sunlamp mercury vapor arcs are customarily used at a distance of 7 to 10 inches from the photopolymerizable layer. On the other hand, with a more uniform extended source of low intrinsic brilliance, such as a group of contiguous fluorescent lamps with special phosphors, the plate can be exposed within an inch of the lamps.

The base material used can be any natural or synthetic product, capable of existence in film or sheet form and can be flexible or rigid, reflective or non-reflective of actinic light. Because of their generally greater strength in thinner form, e.g., foils, and readier adaptability for use in printing presses, it is preferable to use metals as the base materials. However, where weight is critical, the synthetic resins or superpolymers, particularly the thermoplastic ones, are preferable base materials. In those instances where rotary press plates are desired both types of base or support materials can be used to form flat relief plates which are then formed to the desired shape. The thermoplastic resins or high polymers are particularly suitable base materials in such uses. Rotary press plates can also be prepared by using cylindrically shaped base plates of the various types carrying the photopolymerizable compositions and exposing them directly through a concentrically disposed image-bearing transparency in like manner.

Suitable base or support materials include metals, e.g., steel and aluminum plates, sheets and foils, and films or plates composed of various film-forming synthetic resins or high polymers, and in particular the vinylidene polymers, e.g., the vinyl chloride polymers, vinylidene chloride copolymers with vinyl chloride, vinyl acetate, styrene isobutylene and acrylonitrile; and vinyl chloride copolymers with the latter polymerizable monomers; linear condensation polymers such as polyesters, e.g., polyethylene terephthalate; polyamides, e.g., polyhexamethylenesebacamide; polyester amides, e.g., polyhexamethyleneadipamide/adipate; etc. Fillers or reinforcing agents can be present in the synthetic resin or polymer bases such as the various fibers (synthetic, modified, or cellulose acetate, viscose rayon, paper; glass wool; nylon, etc. These reinforced bases may be used in laminated form.

When highly reflective bases and particularly metal base plates are used any oblique rays passing through clear resultant reflection will cause polymerization in non-image surface of the base at an angle other than 90° and after areas in the image-bearing transparency will strike the areas. The degree of unsharpness in the relief progressively increases as the thickness of the desired relief and the duration of the exposure increases. This disadvantage can be overcome, when the photopolymerizable composition is deposited on a light-reflective base, by having an intervening stratum sufficiently absorptive of actinic light so that less than 35% of the incident light is reflected. This light-absorptive stratum must be adherent to both the photopolymerized image and the base material. A practical method of supplying the layer absorptive of reflected light, or non-halation layer, is to disperse a finely-divided dye or pigment which substantially absorbs actinic light in a solution or aqueous dispersion of a resin or polymer which is adherent to both the support and the photopolymerized image and coating it on the support to form an anchor layer which is dried. The antihalation layer may also serve as an anchor layer.

The photopolymerizable layers can also contain immiscible polymeric or non-polymeric organic or inorganic fillers or reinforcing agents which are essentially transparent, e.g., the organophilic silicas, bentonites, silica, powdered glass, etc. having a particle size less than 0.4 mil and in amounts varying with the desired properties of the photopolymerizable layer.

Even when containing monomeric or low polymeric additives as described above, the photopolymerizable compositions of this invention are solids. While their hardness varies from medium hard to very hard, they are nevertheless substantially non-deformable under ordinary conditions, and non-tacky. Thus, they offer considerable physical advantages over photopolymerizable compositions obtained as liquids, viscous liquids or semi-solid gels from the standpoint of forming into convenient printing elements for commercial use.

The solvent liquid used for washing or "developing" the plates made from the photopolymerizable compositions of this invention must be such that it has good solvent action on the non-exposed areas, i.e., the polyvinyl acetal and/or ester, monomer, initiator composition as defined above and has little action on the hardened image in the exposed areas or upon the base material, non-halation layer, or anchor layer in the time required to remove the non-crosslinked portions. Methanol and/or ethanol, particularly the former, and mixtures thereof with methyl or ethyl or propyl acetate, and especially ethyl acetate/ethanol mixtures, are well suited for a large variety of photopolymerizable compositions. An about 75/25 by weight blend of ethyl acetate and ethanol has a boiling range which is satisfactory since it is high enough to avoid blushing but at the same time is low enough that excess solvent evaporates readily. Low aliphatic ketones such as acetone and methyl ethyl ketone are satisfactory solvents. Propyl acetate, toluene, ethylene glycol monoethyl ether and mixtures thereof, are suitable solvents but are not as convenient to use because of their lower evaporation rate. Mixtures of chlorinated aliphatic hydrocarbons such as dichloromethane, chloroform and carbon tetrachloride with methanol are also useful.

This invention provides a simple, effective process for producing letterpress printing plates from inexpensive materials and with a marked reduction in labor requirements over the conventional photoengraving procedure. The images obtained are sharp and show fidelity to the original transparency both in small details and in overall dimensions. In addition, the process allows the preparation of many types of ruled line plates which could ordinarily be handled only by the tedious wax engraving technique. Moreover, these photopolymerized plates allow much more efficient use of valuble press time since the flatness of the printing surfaces reduces the amount of make-ready required on the press. The smooth clean shoulders of the image minimize ink buildup during use and save much of the time spent in cleaning operations during a press run. Another important advantage arises from the fact that the resilience and abrasion resistant characteristics of the photopolymerized printing plates make the plate more durable in use than ordinary metal photoengravings. In fact, under optimum conditions the photopolymerized printing plates show wear resistance equivalent to that of the expensive copper-faced electrotypes. An important commercial advantage is their lightness in weight.

The photopolymerized printing plates can serve as originals for the preparation of stereotypes or electrotypes although in the latter case if only duplicates are desired it is much more convenient and economical to make duplicate photopolymerized plates. Curved plates for use on rotary presses can be prepared easily by bending the flat plates which have been heated sufficiently (generally from 100° to 120° C.) to soften the image layer. It is also possible to prepare curved plates directly by polymerization against a curved negative surface.

The printing elements of this invention can be used in all classes of printing but are most applicable to those classes of printing wherein a distinct difference of height between printing and non-printing areas is required. These classes include those wherein the ink is carried by the raised portion of the relief such as in dry-offset printing, ordinary letterpress printing, the latter requiring greater height differences between printing and non-printing areas and those wherein the ink is carried by the recessed portions of the relief such as in intaglio printing, e.g., line and inverted halftone. The plates are obviously useful for multicolor printing.

The use of the new polymerizable compositions of this invention as photopolymerizable printing relief elements has been described at length in view of its importance. These compositions, however, are also suitable for many other applications in which readily crosslinkable polymers are useful, such as the preparation of coatings, pellicles, sheets and cast objects of excellent hardness and scratch-resistance. An important application in which the properties of these polymers are valuable is the preparation of phosphor patterns for color television screens.

What is claimed is:

1. An addition polymerizable composition comprising (1) a solid vinyl polymer having a wholly carbon chain and containing up to 15% intralinear —$CH_2$—CHOH— groups and recurring intralinear units of at least one of the following types:

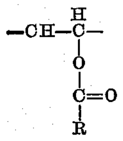

and

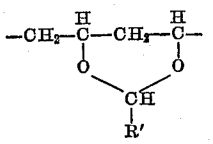

where

is the acyl radical of a non-terminal ethylenically unsaturated carboxylic acid of less than 12 carbon atoms and R'CH< is the non-oxo radical of a non-terminal ethylenically unsaturated aldehyde of less than 12 carbon atoms in combined acetal form, there being 5 to 80% of said intralinear units in the polymer, any remaining lateral substituents being saturated non-polymerizable substituents of 1–18 carbon atoms taken from the group consisting of ester, ether and acetal substituents, (2) as ethylenically unsaturated addition polymerizable monomer boiling above 100° C. at atmospheric pressure and compatible with said polymer and (3) a free-radical generating addition polymerization initiator activatable by actinic light and inactive thermally below 80° C., said monomer being present in an amount from 5% to 35% and said initiator in an amount from 0.05% to 10%, by weight of said three constituents.

2. A composition as defined in claim 1 wherein said polymer is a poly(vinyl acetate co vinyl sorbate).

3. A composition as defined in claim 1 wherein said polymer is a poly(vinyl acetate co vinyl benzal co vinyl crotonal).

4. A photopolymerizable element comprising a sheet support bearing a solid layer from 3 to 250 mils in thickness of an addition polymerizable composition comprising (1) a solid vinyl polymer having a wholly carbon chain and containing up to 15% intralinear

—CH—CHOH— groups and recurring intralinear units of at least one of the following types:

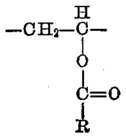

and

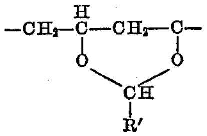

where

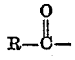

is the acyl radical of a non-terminal ethylenically unsaturated carboxylic acid of less than 12 carbon atoms and R'CH< is the non-oxo radical of a non-terminal ethylenically unsaturated aldehyde of less than 12 carbon atoms in combined acetal form, there being 5 to 80% of said intralinear units in the polymer, any remaining lateral substituents being saturated non-polymerizable substituents of 1–18 carbon atoms taken from the group consisting of ester, ether and acetal substituents, (2) an ethylenically unsaturated addition polymerizable monomer boiling above 100° C. at atmospheric pressure and compatible with said polymer, and (3) a free-radical generating addition polymerization initiator activatable by actinic light and inactive thermally below 80° C., said monomer being present in an amount from 5% to 35% and said initiator in an amount from 0.05% to 10%, by weight, of said three constituents.

5. An element as defined in claim 4 wherein the monomer is present in amounts from 5% to 35% by weight of the total weight of the three constituents.

6. An element as defined in claim 4 wherein the monomer is present in amounts from 10% to 25% by weight of the total weight of the three constituents.

7. An element as defined in claim 6 wherein said layer is at least 3 mils in thickness.

8. An element as defined in claim 7 wherein said layer is 10 to 50 mils in thickness.

References Cited in the file of this patent

UNITED STATES PATENTS

| | | |
|---|---|---|
| 2,367,661 | Agre | Jan. 23, 1945 |
| 2,527,495 | Fitzhugh | Oct. 24, 1950 |
| 2,544,905 | Van Deusen | Mar. 13, 1951 |
| 2,739,892 | Murray | Mar. 27, 1956 |
| 2,791,504 | Plambeck | May 7, 1957 |